United States Patent
Roeschke et al.

(10) Patent No.: US 10,355,650 B2
(45) Date of Patent: *Jul. 16, 2019

(54) CONTROLLING MECHANISM FOR A DIRECT LEARNING ALGORITHM

(71) Applicant: Nokia Solutions and Networks GmbH and Co. KG

(72) Inventors: Rene Roeschke, Mammendorf (DE); Shavantha Kularatna, Flower Mound, TX (US); Bjoern Jelonnek, Ulm (DE); Christian Reichl, Hirschau (DE)

(73) Assignee: Nokia Solutions And Networks GMBH And Co. KG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/549,870

(22) PCT Filed: Feb. 10, 2015

(86) PCT No.: PCT/EP2015/052686
§ 371 (c)(1),
(2) Date: Aug. 9, 2017

(87) PCT Pub. No.: WO2016/128025
PCT Pub. Date: Aug. 18, 2016

(65) Prior Publication Data
US 2018/0034422 A1   Feb. 1, 2018

(51) Int. Cl.
H03F 1/26  (2006.01)
H03F 1/32  (2006.01)
(Continued)

(52) U.S. Cl.
CPC .......... H03F 1/3247 (2013.01); H03F 1/3258 (2013.01); H03F 3/195 (2013.01);
(Continued)

(58) Field of Classification Search
CPC ...... H03F 1/3247; H03F 3/195; H03F 1/3258; H03F 3/245; H03F 2200/451; H03F 2201/3212
(Continued)

(56) References Cited

FOREIGN PATENT DOCUMENTS

WO   WO 2012/092647 A1   7/2012

OTHER PUBLICATIONS

Boudinov, Edouard R., et al., "An efficient conjugate direction method with orthogonalization for large-scale quadratic optimization problems", Optimization Methods and Software, vol. 22, No. 2, Apr. 1, 2007, 26 pgs.
(Continued)

Primary Examiner — Khanh V Nguyen
Assistant Examiner — Khiem D Nguyen
(74) Attorney, Agent, or Firm — Harrington & Smith

(57) ABSTRACT

The present invention addresses method, apparatus and computer program product for controlling a Direct Learning Algorithm. Thereby, a power amplifier operating in a non-linear state is controlled. A signal to be amplified is input to a pre-distorter provided for compensating for non-linearity of the power amplifier. The pre-distorted output signal is forwarded from the pre-distorter to the power amplifier. Parameters of the pre-distorter are adapted in plural steps based on an error between a linearized signal output from the power amplifier and the signal to be amplified using an adaptive direct learning algorithm. It is detected whether the error diverges; and adapting of the parameters of the pre-distorter is stopped when it is determined that the error is diverging.

20 Claims, 3 Drawing Sheets

(51) Int. Cl.
*H03F 3/195* (2006.01)
*H03F 3/24* (2006.01)

(52) U.S. Cl.
CPC ....... *H03F 3/245* (2013.01); *H03F 2200/451* (2013.01); *H03F 2201/3212* (2013.01)

(58) Field of Classification Search
USPC ................ 330/149; 375/296, 297; 455/114.3
See application file for complete search history.

(56) References Cited

OTHER PUBLICATIONS

Kecman, Vojislav, et al., "Algorithms for Direct L2 Support Vector Machines", © 2014 IEEE, 6 pgs.

Zayani, Rafik, et al., "Levenberg-Marquardt Learning Neural Network for Adaptive Predistortion for Time-Varying HPA with Memory in OFDM Systems", $16^{th}$ European Signal Processing Conference (EUSIPCO 2008), Lausanne, Switzerland, Aug. 25-29, 2008, © by EURASIP, 5 pgs.

Mkadem et al., "Physically Inspired Neural Network Model for RF Power Amplifier Behavioral Modeling and Digital Predistortion", IEEE, vol. 59, No. 4, Apr. 2011, pp. 913-923.

CONTROLLING MECHANISM FOR A DIRECT LEARNING ALGORITHM

FIELD OF THE INVENTION

The present invention relates to an apparatus, a method and a computer program product for controlling a Direct Learning Algorithm.

BACKGROUND

In wireless mobile communication, often linear power amplifiers PA are required for radio frequency RF transmissions. However, in general, low power consumption is aspired for mobile systems. Therefore, a power amplifier may be operated at compressed regions.

In general, a power amplifier and an associated low power analog transmitter in radio devices behave non-linearly when operated at compressed regions. Since non-linearity may cause severe problems in regard of control of the system, it is expedient to eliminate or at least abate the non-linearity thereof. One possible approach that solves the non-linearity issue is to back off considerably so that the operation region becomes linear. However, this is very inefficient and does not yield the desired power savings.

Hence, a Digital Pre-Distortion (DPD) algorithm is often used in Radios that allows the RF signal to operate in the compression region. Operating in compressive regions will bring power savings due to increased efficiency. However, operating in such regions will also increase the inter modulation (IM) products. Increased IM products in general, violate the 3GPP specifications. Hence the primary role of the DPD (Digital Pre-Distortion) algorithm is to reduce the IM products so that the radio can operate efficiently in compliance with the 3GPP specifications.

A certain DPD algorithm belongs to a category called DLA (Direct Learning Algorithm). In DLA, the non-linearity is modeled from input to the output. An example would be the modeling of a power amplifier from input to the output. In other words, the output is described by input variables and the input signal.

Therefore DLA does not produce an inverse model of the power amplifier, rather it models the power amplifier directly. Hence, to obtain the inverse, an iterative process is normally pursued. This iterative inversion process is generally fixed to a pre-determined number of iterations (i.e. 2, 3, . . . 5 etc). Examples are the fixed point algorithms with N1 iterations or the Newton Method with N2 iterations. N1 and N2 are selected based on the required convergence accuracy of the inverse model. Another factor that limits N1 and N2 are hardware limitations.

However, it very common to have DLA implemented adaptively via a modified fixed point algorithm or a modified Newton method. The Newton method is extremely complex; hence a modified fixed point algorithm is more suited due to its simpler form compared with the Newton method.

In a wireless/cellular environment, a continuous adaptation of the DPD algorithm has to take place in anticipation of changes of the power amplifier. However, such a continuous adaptation can bring instability due to numerical error accumulation (e.g. floating point errors). This is because when adaptations tend to be very large, even a small numerical error per step can cause a huge accumulation of noise. Numerical error accumulation had been an ongoing problem that had prevented the best performance for the DLA algorithm.

SUMMARY OF THE INVENTION

Embodiments of the present invention address this situation and aim to overcome the above-described problem and to provide a more stabilized operation of a power amplifier with digital pre-distortion.

According to a first aspect of the present invention, there is provided a method for controlling a power amplifier operating in a non-linear state, comprising: inputting a signal to be amplified to a pre-distorter provided for compensating for non-linearity of the power amplifier; forwarding the pre-distorted output signal from the pre-distorter to the power amplifier; adapting parameters of the pre-distorter in plural steps based on an error between a linearized signal output from the power amplifier and the signal to be amplified using an adaptive direct learning algorithm; detecting whether the error diverges; and stopping adapting the parameters of the pre-distorter when it is determined that the error is diverging.

According to a second aspect of the present invention, there is provided an apparatus for controlling a power amplifier, comprising: a pre-distorter; at least one processor, and at least one memory for storing instructions to be executed by the processor, wherein the at least one memory and the instructions are configured to, with the at least one processor, cause the apparatus at least to perform inputting a signal to be amplified to a pre-distorter provided for compensating for non-linearity of the power amplifier; forwarding the pre-distorted output signal from the pre-distorter to the power amplifier; adapting parameters of the pre-distorter in plural steps based on an error between a linearized signal output from the power amplifier and the signal to be amplified using an adaptive direct learning algorithm; detecting whether the error diverges; and stopping adapting the parameters of the pre-distorter when it is determined that the error is diverging.

According to a third aspect of the present invention, there is provided a computer program product comprising computer-executable components which, when the program is run, are configured to carry out the method according to the first aspect.

Advantageous further developments or modifications of the aforementioned exemplary aspects of the present invention are set out in the dependent claims.

According to certain embodiments of the invention, a stored state may be restored when it is detected that the error is diverging.

According to certain embodiments of the invention, an error gradient of the error may be detected, and it may be determined based on the error gradient whether the error is diverging.

According to certain embodiments of the invention, the number of occurrences that the error gradient is positive may be detected, when error gradient is greater than zero, and the parameters may be adapted continuously until the number of occurrences exceeds a threshold.

According to certain embodiments of the invention, when the error gradient is equal to zero or lower than zero, it may be determined whether an amount of the error is larger than a threshold, and, in case the amount of the error is larger than a threshold, a restart of adapting the parameters of the pre-distorter may be initiated.

According to certain embodiments of the invention, an error scaling factor may be introduced in the adaptive direct learning algorithm, so as to fulfill the following equation:

$$y(n)=x(n)-\mu^{*}e(n)$$

wherein y is the pre-distorted signal, x is the signal to be amplified, e is the error, μ is the error scaling factor, and n indicates the adaptation number.

The error scaling factor may be set to a value smaller than 1.0

According to certain embodiments of the invention, the error scaling factor may be set to a value equal to 1.0 when starting or restarting the adapting of the parameters of the pre-distorter.

According to certain embodiments of the invention, the parameters may be adapted by solving a linear system of equations formed by using an auto correlation matrix, wherein a noise factor may be added to single or multiple diagonal elements of the auto-correlation matrix.

BRIEF DESCRIPTION OF THE DRAWINGS

These and other objects, features, details and advantages will become more fully apparent from the following detailed description of embodiments of the present invention which is to be taken in conjunction with the appended drawings, in which.

DETAILED DESCRIPTION OF EMBODIMENTS

In the following, description will be made to embodiments of the present invention. It is to be understood, however, that the description is given by way of example only, and that the described embodiments are by no means to be understood as limiting the present invention thereto.

Before describing embodiments of the present invention, the problem underlying embodiments of the present invention is described in more detail.

Figure 1:
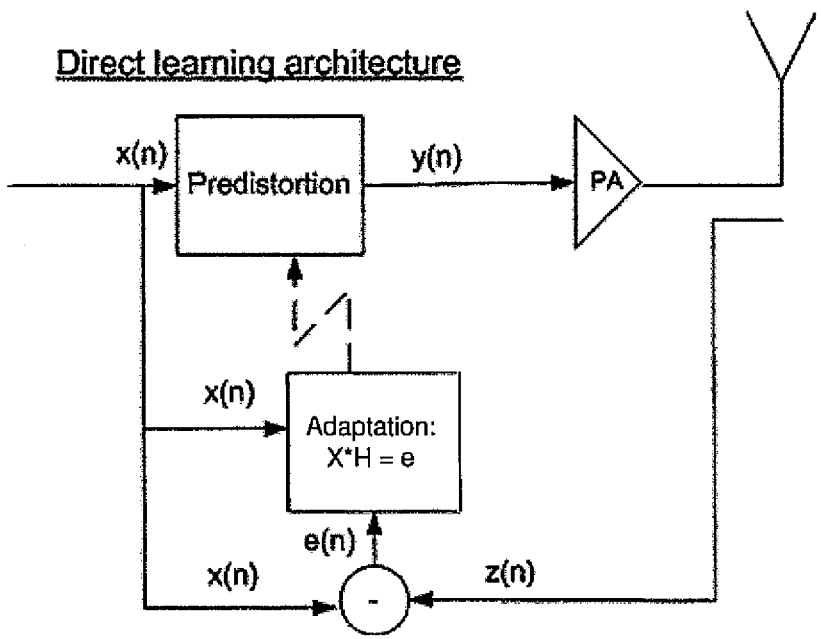
FIG. 1 shows an adaptive direct learning algorithm.

An adaptive DLA algorithm designed with the fixed point flavor is shown in FIG. 1. All the equations describing the method are also given with the figure, as will be described in the following. The adaptive algorithm has the benefit of iteratively improving the modeling accuracy each time. This is better than implementing it in hardware where the iterative inverse is limited to a small number such as 4, 6, or even 10. Adaptive DLA does not have the same restriction.

In a wireless/cellular environment, the continuous adaptation of the DPD algorithm has to take place in anticipation of the PA change. However, the continuous adaptation can bring instability due to numerical error accumulation (e.g. floating point errors). This is because when adaptations tend to be very large, even a small numerical error per step can cause a huge accumulation of noise. Numerical error accumulation had been an ongoing problem that had prevented obtaining the best performance for the DLA algorithm.

In some instances (more likely with narrow band signals) instability occurs after 1000s of adaptations. However, with wideband signals, this instability can occur in less than 100 adaptations. If this instability is not checked, the adaptive DLA algorithm will diverge causing inter modulation products to rise with time.

In the following, supported equations of the adaptive DLA (with fixed point flavor) are described by referring to FIG. 1. Note that the formulas supporting FIG. 1 will diverge when the accumulated floating point error is significant compared to the inter-modulation (IM) corrections.

x(n): Un pre-distorted signal y(n): Pre-distorted signal.

z(n): Linearized signal. In the best case this signal should be as close as possible to x(n). For simplicity, gain and phase of the PA are normalized to unity gain and zeros phase. That is, z(n) is a normalized ouput of the PA, i.e., is the linearized signal that has been normalized by the complex gain of the PA.

e(n): Error between z(n) and x(n). The idea is to minimize this error.

In the following, equations supporting the conventional DLA are described:

At adaptive step n, an error between the linearized signal z(n) and the input signal x(n) is determined:

$$e(n)=z(n)-x(n)$$

The adaption is performed by solving a system of linear equations in the form of A*H=b, wherein a solution for the vector H is searched. The coefficients of the vector H give the parameters to be applied for the adapted pre-distortion.

The matrix A is calculated based a matrix X, which is calculated based on x(n) as follows:

$$X = [x'(n)x'(n-1)x'(n-T) \ldots x'(n)$$
$$|x'(n)|^{L1}x'(n-1)|x'(n-1)|^{L1}x'(n-T)|x'(n-T)|^{L1}$$
$$\ldots$$
$$\ldots$$
$$x'(N+n)x'(N+n-1)x'(N+n-T) \ldots x'(N+n)|x'(N+n)|^{L1}$$
$$x'(N+n-1)|x'(N+n-1)|^{L1}x'(N+n-T)|x'(N+n-t)|^{L1}]$$
$$H = [h'(n)h'(n-1) \ldots h'(n-T)]^T$$
$$(X^H X)*H = X^H E$$
$$E = [e'(n)e'(n+1) \ldots e'(n+N)]^T$$
$$A*H = b \text{ form}$$

X is a matrix that consists of linear and non-linear elements.

In the A*H=b form, A is the autocorrelation matrix ($X^H X$) and the b is the cross correlated vector $X^H E$. E is the error vector, as shown above. L1 in the above equation depicts the order of non-linearity. It is to be noted that in this terminology e(n) is a vector at $n^{th}$ time, where as e'(n) is not. Similarly h'(n) is not a vector but a single sample. H is a vector.

Generating the pre-distorted signal at adaptive step n is as follows:

$$y(n)=x(n)-\mu*e(n)$$

where $\mu=\mu_0$

Where, e(n)=X(1,:)*H

X(1,:) is the $n^{th}$ row of the Matrix X

As shown in the equations, when the system is near optimum convergence, z(n) is as close as it can be to x(n). e(n) is considerably small. Errors are now significant compared to when e(n) was large at the beginning of the adaptation process.

Hence, the continued operation of the same steps at convergence will cause floating point errors to accumulate. These errors will then be absorbed by the matrix solution to the vector H, where H=[h' (n)h' (n−1) . . . h'(n−T)].

Typical Matrix solutions used in this case are: LU decomposition, Cholesky decomposition etc. This error accumulation process causes divergence of the DLA algorithm.

Thus, the conventional adaptive DLA algorithm can be unstable.

Embodiments of the present invention overcome this problem.

Figure 2:
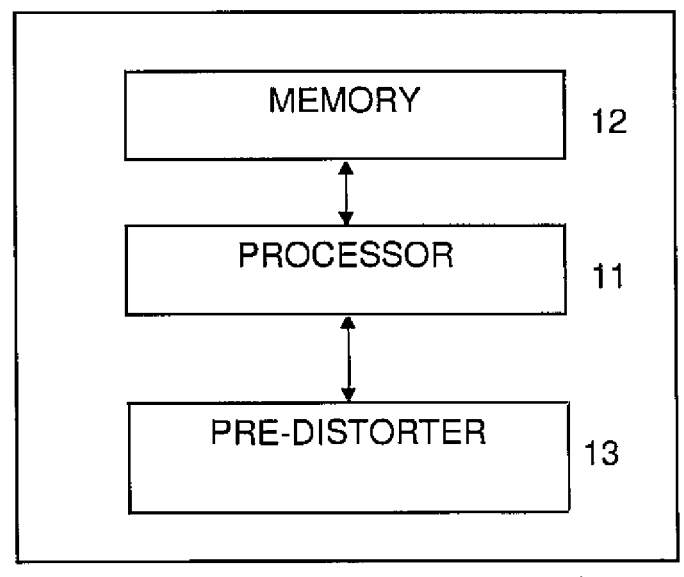
FIG. 2 shows a simplified overview of an apparatus for controlling a power amplifier according to an embodiment of the present invention.

FIG. 2 shows a simplified block diagram of an apparatus 1 for controlling a power amplifier operating in a non-linear state according to certain embodiments of the present invention. The apparatus 1 comprises a processor 11 and a memory 12 for storing instructions to be executed by the processor. In addition, a per-distorter 13 is provided, by which the non-linearity of the power amplifier is to be canceled out.

The processor 11 is configured to input a signal to be amplified to the pre-distorter 13 provided for compensating for non-linearity of the power amplifier; to forward the pre-distorted output signal from the pre-distorter 13 to the power amplifier; to adapting parameters of the pre-distorter 13 in plural steps based on an error between a linearized signal output from the power amplifier and the signal to be amplified using an adaptive direct learning algorithm; to detecting whether the error diverges; and to stop adapting the parameters of the pre-distorter 13 when it is determined that the error is diverging.

Hence, in this way the DLA is stopped when it is detected that the error is diverging. Thus, the DLA can be stabilized.

When it is detected that there is a divergence, a stored state may be restored (e.g. parameters determined at a DLA startup). Alternatively, stored parameters could also be some optimum parameters at any given time. With the error vector it is possible to determine where the optimum parameters will be; usually, when the error vector is at its smallest value or the absolute of gradient is small as well.

Moreover, it may determined based on an error gradient whether the error is diverging or not.

Furthermore, when error gradient is greater than zero (i.e., positive), it may be determined that there is an occurrence of divergence only when it is detected for a number of times that the error gradient is positive. This can avoid an erroneous determination due to noise or the like.

The above measures are described in the following by referring to a more detailed embodiment of the present invention.

According to certain embodiments, the DLA instability described above is solved by non-algorithmic methods. Non-algorithmic methods are based on control mechanisms whereby error accumulation is allowed but monitored with special markers such as the error gradient and the Error Vector. When, markers indicate that the solution is diverging, the system is restored to a previously stored state. The stored state is closer to the optimum solution but it does not need to be very accurate. The selection criteria below will show how and when to store this restoration model.

The controlling mechanism includes 2 steps:
1) Use of the markers and detection of the divergent point
2) Prolonging the divergence (i.e. SW does not need to act quickly when divergence point is extended)

Both steps are independent and can be implemented separately. However, they complement each other. For example prolonging the convergence will make step 1) easier to implement in SW.

1) Use of the Markers and Detection of the Divergent Point

It is referred to the DLA algorithm section described above. The error gradient is computed after calculating H. The error gradient is described as follows:

Error Gradient=$\nabla(E)$ where the error in vector form is E=[e'(n) e'(n+1) ... e'(n+N)]

While the computation of the error gradient is complex, the algorithm can be implemented with a simple derivative of E with respect to coefficients obtained by the vector H as well (See the DLA description).

At the beginning of each step, the error vector is computed:

E=[e'(n)e'(n+1) ... e'(n+N)]

Error Vector=$\sqrt{E^*E'}$

E'=is the conjugated transpose

Thus, at each step of the adaptation, the following is calculated (see also the explanation of the conventional DLA as given above):

$$e'(n) = z'(n) - x'(n)$$

$$E = [e'(n)e'(n+1) \ldots e'(n+N)]$$

$$\text{Error Vector} = \sqrt{E * E'}$$

$E'$ = is the conjugated transpose $$X = [x'(n)x'(n-1)x'(n-T) \ldots x'(n)$$

$$|x'(n)|^{L1}x'(n-1)|x'(n-1)|^{L1}x'(n-T)|x'(n-T)|^{L1}$$

...

...

$$x'(N+n)x'(N+n-1)x'(N+n-T) \ldots x'(N+n)|x'(N+n)|^{L1}$$

$$x'(N+n-1)|x'(N+n-1)|^{L1}x'(N+n-T)|x'(N+n-t)|^{L1}]$$

$$H = [h'(n)h'(n-1) \ldots h'(n-T)]^T$$

$$(X^H X) * H = X^H E$$

$$E = [e'(n)e'(n+1) \ldots e'(n+N)]^T$$

$$A * H = b \text{ form}$$

$$\text{Error Gradient} = \nabla(E)$$

where the error in vector form is $E = [e'(n)e'(n+1) \ldots e'(n+N)]$

As already mentioned above, it is noted that X is a matrix that consists of linear and non-linear elements. In the A*H=b form, A is the autocorrelation matrix ($X^H X$) and the b is the cross correlated vector $X^H E$. E is the error vector, as shown above. L1 in the above equation depicts the order of non-linearity. It is to be noted that in this terminology e(n) is a vector at $n^{th}$ time, where as e'(n) is not. Similarly h'(n) is not a vector but a single sample. H is a vector.

In general if the solution is perfect then the error vector should be very small or rather zero.

Now that both markers are defined, the control mechanism that stabilizes the DLA is described below:

DLA Startup

The DLA startup procedure is summarized as follows:

Set μ=1 and start the adaptation process

Compute the error gradient at each step ($\nabla(E)$)

If (error gradient<0 && error gradient>Threshold EG1)

Store the state: This includes coefficients from vector H
(see: A*H=b step)
end

The threshold EG1 is a negatively small value, for example −1e-5. As a modification, also the error vector may be compared to a certain threshold.

Figure 3:
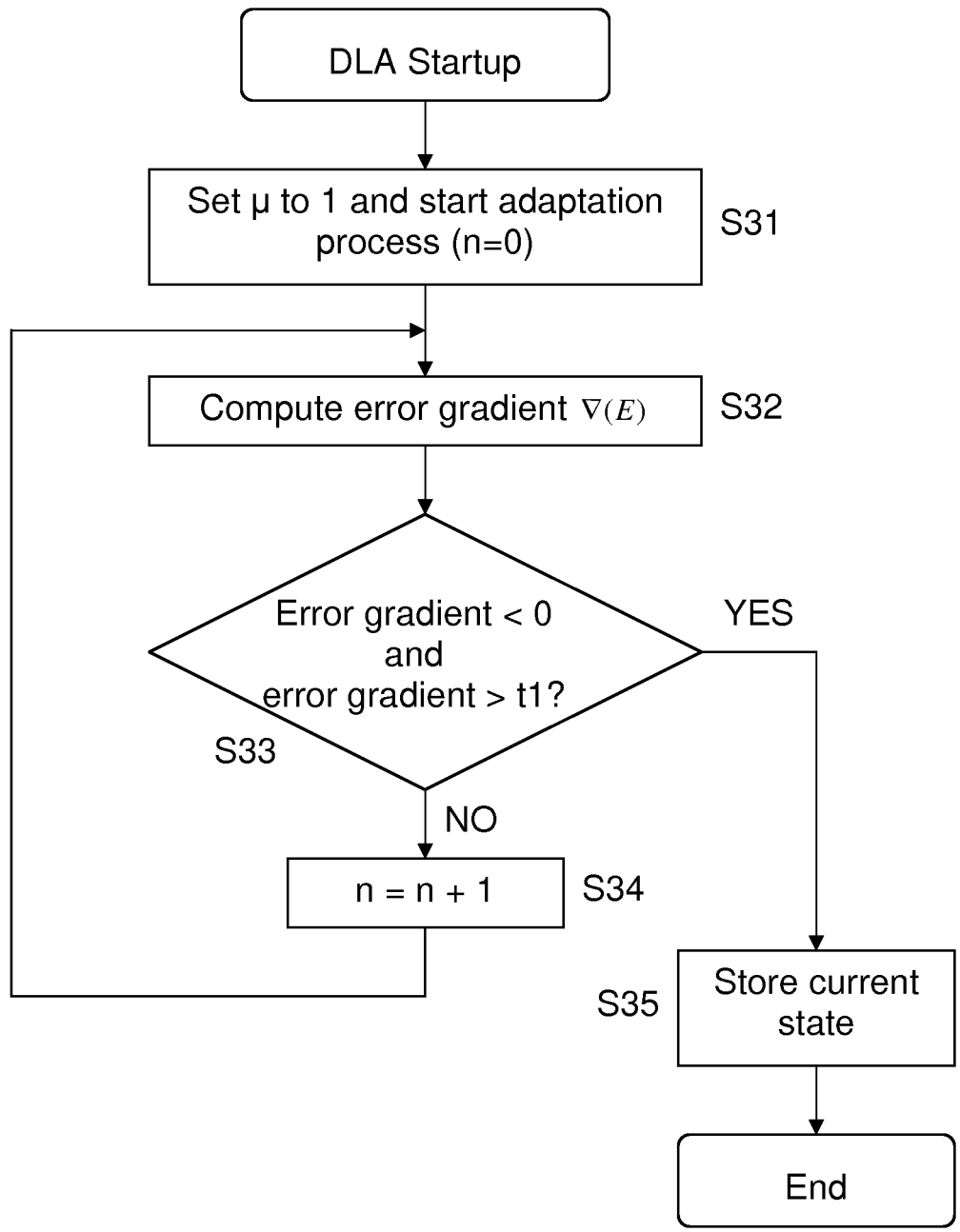
FIG. 3 shows a flowchart of a DLA startup procedure according to an embodiment of the present invention.

The procedure is also described in the following by referring to the flowchart shown in FIG. 3.

In step S31, μ is set to 1, so that the adaption process can be carried out quickly. Also, n is reset to 0, since the process is started. In step S32, the computation described above is carried out, and in particular the error gradient is computed. In step S33 it is checked whether the error gradient is smaller than 0 and the error gradient is larger than the threshold t1. If not, the adaptation process is continued, wherein in step S34 n is incremented. If the error gradient is smaller than 0 and the error gradient is larger than the threshold t1 (YES in step S34), the current state is stored in step S35, and the procedure is ended.

Thus, the initial adaptation process is carried out until the error gradient is negative and the error gradient is greater than a threshold EG1. Then, the current state (defined by the coefficients of the vector H) is stored.

DLA Continuation

The DLA continuation, i.e., the procedure carried out during normal operation of the power amplifier is summarized in the following:

Set μ=μ$_1$ and start the adaptation process (Note: μ can take any other value that is less than 1).

If (error gradient<0 && Error Vector<threshold EV1)
    Continue DLA: Since the Gradient is negative, the error vector continues to improve and becomes smaller.

If (error gradient<0 && Error Vector>threshold EV1)
    Continue DLA: Sudden change of Error Vector is due to a sudden PA change. This could be a result of a traffic profile change that causes PA model to change. In order to adapt quickly to the changed environment μ is set to 1.0. DLA startup is initiated.

Else if (error gradient>0 && Occurrence threshold<O1)
    Continue DLA: Since the Gradient is positive some divergence will begin to occur. An adequate occurrence threshold O1 of 100 or any other satisfactory value is set here. This is to avoid noise giving a false trigger.

Figure 4:
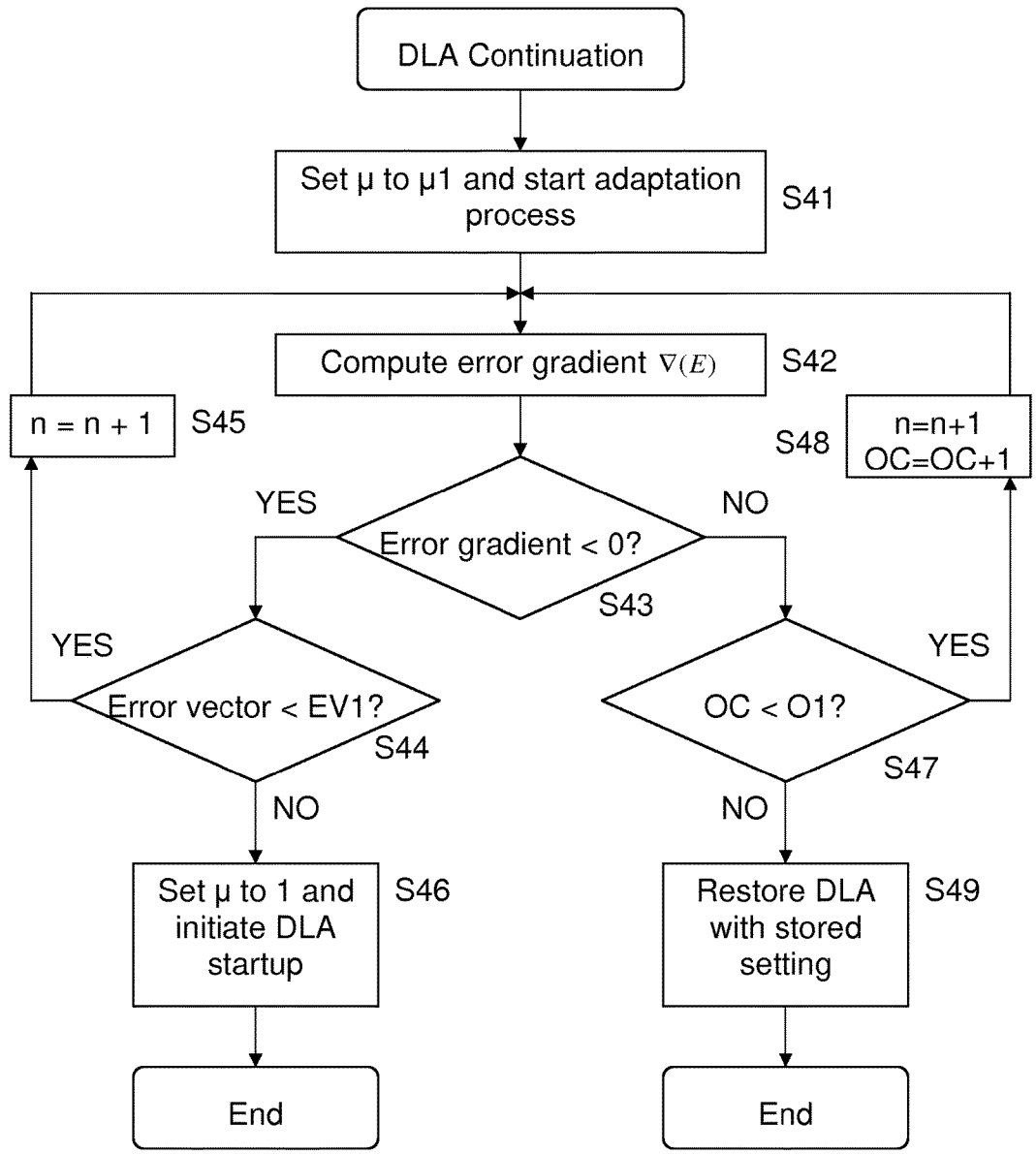
FIG. 4 shows a flowchart of a DLA continuation procedure according to an embodiment of the present invention.

Else if (error gradient>0 && Occurrence threshold>O1)
    Restore DLA with stored stetting at Startup: Since the Gradient is positive and it exceeded the Occurrence threshold, it is can be concluded that the divergence is occurring. Restore the coefficient vector H with values stored at the startup. Also, the vector E is restored as follows: (i.e. E=X*H).
    Set the Occurrence counter to zero.
end The procedure is also described in the following by referring to the flowchart shown in FIG. 4.

In step S41, μ is set to μ1, and the adaption process is started. In step S42, the computation described above is carried out, and in particular the error gradient is computed. In step S43 it is checked whether the error gradient is smaller than zero. If yes, it is checked in step S44 whether the error vector is smaller than the threshold EV1. If yes, the DLA is continued by incrementing n in step S45. If the error vector is not smaller than the threshold EV1 (NO in step S44), a sudden change can be assumed, as mentioned above. Hence, the DLA startup procedure (FIG. 3) is initiated by setting μ to 1 in step S46.

In case in step S43 it is determined that the error gradient is not smaller than zero (NO), it is checked in step S47 whether an occurrence counter OC is smaller than an occurrence threshold O1 (which may be 100, for example) in step S47. If so, DLA is continued by incrementing n in step S48, wherein also the occurrence counter is incremented. If the occurrence counter OC is not smaller than the occurrence threshold O1 in step S47 (NO), it is determined that indeed divergence is occurring, so that the DLA is restored with the stored setting at the startup.

The different thresholds used above can be set in advance in a suitable manner.

Thus, according to the embodiment above, it is determined to continue DLA based on the gradient of the error. In case the error is negative, the DLA is continued. However, if in this case the error vector exceeds a certain threshold (EV1), then it is conclude that there is some major change in the environment or traffic or the like, so that DLA startup is initiated. On the other hand, in case the error gradient is positive, it is not directly concluded that there is a divergence. That is, the number of occurrences, i.e. how often a positive error gradient is detected, is checked. Only if the occurrences exceed a certain threshold (O1), then it is concluded that there is a divergence, and stored state (stored at the initial DLA startup) is restored.

Thus, the DLA can be stabilized.

2) Prolonging the Divergence

Prolonging the divergence is a tactic whereby software has room to act on divergence. This is performed by two methods. One was described as part of the control mechanism above where μ is set to a much smaller value than 1.0. This will slow down the accumulation of floating point errors. An example is a signal form that diverges at adaptation 100 when μ is set to 1.0. When then by setting μ equal to 0.25, it generally extends the divergence point by a factor greater than 4.

Another form of prolonging the divergence is treating the auto-correlation matrix. Large condition numbers are observed in the auto-correlation matrix when modeling Power Amplifiers. Such condition numbers will result in inaccuracies of the computed coefficients as it eats away the double precision accuracy of the computer platform.

Numerical inaccuracies of the DLA algorithm are accumulated in the vector E (i.e. [e'(n)e'(n+1) . . . e'(n+N)]). This error will then perturb the cross-correlation vector. The cross correlation vector is given by: $X^H E$.

This perturbation of elements of the cross-correlation vector causes large changes of the associated coefficients on H. H is related to the cross-correlation matrix by: $(X^H X)$ $*H = X^H E$.

If the above matrix form is denoted by A*H=b. Restricting the coefficient movement is achieved with the traditional fixed Tikhonov noise as shown below:

$$A*H=b$$

$$A=A+\lambda*I$$

where λ is small noise factor (such as 1e−8); depending on the power of auto-correllation matrix I is an identity matrix of size A However the traditional Tikhonov method shown above is not sufficient in restricting the coefficient movement. Hence, the authors have proposed a novel idea called the adaptive Tikhonov. With the adaptive Tikhonov method, noise is not added to all the diagonal elements of the auto-correlation matrix A. Rather sufficient Tikhonov noise is added to a single or multiple of the diagonal elements that pose the problem.

Suppose that the $n^{th}$ coefficient displayed a large movement. The adaptive Tikhonov will add incremental noise only the $n^{th}$ diagonal element of the correlation matrix A. The procedure is shown below:

$$A(n,n)=A(n,n)+n_2$$

where $n_2$ is a small noise factor (such as 1e−7)

In general $n_2$ is a little larger compared to the fixed Tikhonov value. Adaptive Tikhonov is increased until the coefficient H(n) is constrained within an acceptable value. Authors of this invention report find that with adaptive Tikhonov procedure, DLA divergence point can be further extended Thus, by the embodiments described above it is achieved that the DLA process is stabilized. Hence, a reduced use of the ASIC resources and improved performance is provided compared to the existing fixed point based iterative inversion method. Due to the iterative nature of the improved DLA method, it is also ideally suited for small cells.

It is noted that the embodiments and the present invention in general is not limited to the specific examples given above.

For example, in the above embodiment it was described that after detecting that the divergence is occurring, the coefficient vector H is restored with values stored at the startup. However, alternatively, the coefficients of the vector H may be stored at each adaptation step, so that the coefficients of a vector H stored before a first occurrence of a divergence may be restored.

It is to be understood that any of the above modifications can be applied singly or in combination to the respective aspects and/or embodiments to which they refer, unless they are explicitly stated as excluding alternatives.

In the foregoing exemplary description of the apparatus, only the units that are relevant for understanding the principles of the invention have been described using functional blocks. The apparatuses may comprise further units that are necessary for its respective function. However, a description of these units is omitted in this specification. The arrangement of the functional blocks of the apparatuses is not construed to limit the invention, and the functions may be performed by one block or further split into sub-blocks.

According to exemplarily embodiments of the present invention, a system may comprise any conceivable combination of the thus depicted devices/apparatuses and other network elements, which are arranged to cooperate as described above.

Embodiments of the present invention may be implemented as circuitry, in software, hardware, application logic or a combination of software, hardware and application logic.

As used in this application, the term "circuitry" refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The present invention relates in particular but without limitation to mobile communications, for example to environments under GSM, HSDPA, UMTS, LTE, WCDMA, WIMAX and WLAN and can advantageously be implemented also in controllers, base stations, user equipments or smart phones, or personal computers connectable to such networks. That is, it can be implemented as/in chipsets to connected devices, and/or modems thereof.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

The following meanings for the abbreviations used in this specification apply:
3GPP $3^{rd}$ Generation Partnership Project
DLA direct learning algorithm
DPD Digital Pre-Distortion
ILA Indirect Learning Algorithm
IM Inter Modulation
PA Power Amplifier
RF Radio Frequency

The invention claimed is:
1. A method comprising:
inputting a signal to be amplified to a pre-distorter provided for compensating for non-linearity of a power amplifier;
forwarding a pre-distorted output signal from the pre-distorter to the power amplifier;
obtaining a linearized signal output from the power amplifier;
comparing the linearized signal output to the signal to be amplified;
calculating an error between the linearized signal output and the signal to be amplified;
adapting parameters of the pre-distorter in plural successive steps based on the error between the linearized signal output from the power amplifier and the signal to be amplified using an adaptive direct learning algorithm;
detecting whether the error diverges following individual ones of said plural successive steps; and
stopping adapting the parameters of the pre-distorter when the error is diverging.

2. The method according to claim 1, wherein a state of the adaptive direct learning algorithm is restored when the error is diverging.

3. The method according to claim 1, further comprising:
calculating an error gradient of the error by taking the difference between errors calculated in successive ones of said plural successive steps; and
determining, based on the error gradient, whether the error is diverging.

4. The method according to claim 3, further comprising:
when the error gradient is greater than zero, detecting the number of occurrences that the error gradient is positive; and
continuing adapting the parameters until the number of occurrences exceeds a threshold.

5. The method according to claim 3, further comprising:
when the error gradient is equal to zero or lower than zero, determining whether an amount of the error is larger than a threshold; and
when the amount of the error is larger than a threshold, initiating a restart of adapting the parameters of the pre-distorter.

6. The method according to claim 1, wherein an error scaling factor is introduced in the adaptive direct learning algorithm, so as to fulfill the following equation:

$$y(n)=x(n)-\mu*e(n)$$

wherein y is the pre-distorted signal, x is the signal to be amplified, e is the error, μ is the error scaling factor, and n indicates the adaptation number, the adaptation number being a positive integer.

7. The method according to claim 6, wherein the error scaling factor is set to a value smaller than 1.0.

8. The method according to claim 6, further comprising:
setting the error scaling factor to a value equal to 1.0 when starting or restarting the adapting of the parameters of the pre-distorter.

9. The method according to claim 1, wherein the parameters are adapted by solving a linear system of equations formed by using an auto correlation matrix, the method further comprising:
adding a noise factor to single or multiple diagonal elements of the auto-correlation matrix.

10. An apparatus comprising:
a pre-distorter;
at least one processor; and
at least one memory for storing instructions to be executed by the processor, wherein the at least one memory and the instructions are configured, with the at least one processor, to cause the apparatus at least to perform:
inputting a signal to be amplified to a pre-distorter provided for compensating for non-linearity of a power amplifier;
forwarding a pre-distorted output signal from the pre-distorter to the power amplifier;
obtaining a linearized signal output from the power amplifier;
comparing the linearized signal output to the signal to be amplified;
calculating an error between the linearized signal output and the signal to be amplified;
adapting parameters of the pre-distorter in plural successive steps based on the error between the linearized signal output from the power amplifier and the signal to be amplified using an adaptive direct learning algorithm;
detecting whether the error diverges following individual ones of said plural successive steps; and
stopping adapting the parameters of the pre-distorter when the error is diverging.

11. The apparatus according to claim 10, wherein the at least one memory and the instructions are configured, with the at least one processor, to cause the apparatus to further perform:
restoring a state of the adaptive direct learning algorithm when the error is diverging.

12. The apparatus according to claim 10, wherein the at least one memory and the instructions are configured, with the at least one processor, to cause the apparatus to further perform:
calculating an error gradient of the error by taking the difference between errors calculated in successive ones of said plural successive steps; and
determining, based on the error gradient, whether the error is diverging.

13. The apparatus according to claim 12, wherein the at least one memory and the instructions are configured, with the at least one processor, to cause the apparatus to further perform:
when the error gradient is greater than zero, detecting the number of occurrences that the error gradient is positive; and
continuing adapting the parameters until the number of occurrences exceeds a threshold.

14. The apparatus according to claim 12, wherein the at least one memory and the instructions are configured, with the at least one processor, to cause the apparatus to further perform:
when the error gradient is equal to zero or lower than zero, determining whether an amount of the error is larger than a threshold; and
when the amount of the error is larger than a threshold, initiating a restart of adapting the parameters of the pre-distorter.

15. The apparatus according to claim 10, wherein an error scaling factor is introduced in the adaptive direct learning algorithm, so as to fulfill the following equation:

$$y(n)=x(n)-\mu*e(n)$$

wherein y is the pre-distorted signal, x is the signal to be amplified, e is the error, μ is the error scaling factor, and n indicates the adaptation number, the adaptation number being a positive integer.

16. The apparatus according to claim 15, wherein the error scaling factor is set to a value smaller than 1.0.

17. The apparatus according to claim 15, wherein the at least one memory and the instructions are configured, with the at least one processor, to cause the apparatus to further perform:
setting the error scaling factor to a value equal to 1.0 when starting or restarting the adapting of the parameters of the pre-distorter.

18. The apparatus according to claim 10, wherein the parameters are adapted by solving a linear system of equations by using an auto correlation matrix, and wherein the at least one memory and the instructions are configured, with the at least one processor, to cause the apparatus to further perform:
adding a noise factor to single or multiple diagonal elements of the auto-correlation matrix.

19. A computer program product comprising a non-transitory computer-readable storage medium bearing computer program code embodied therein for use with a computer, the computer program code comprising code for performing the method of claim 1.

20. The computer program product according to claim 19, wherein the computer program product is at least one of directly loadable into the internal memory of the computer and transmittable via a network by at least one of upload, download and push procedures.

\* \* \* \* \*